United States Patent
Chen et al.

(10) Patent No.: US 12,002,887 B2
(45) Date of Patent: Jun. 4, 2024

(54) ARRAY SUBSTRATE AND METHOD FOR MANUFACTURING THE SAME, AND DISPLAY DEVICE

(71) Applicants: ORDOS YUANSHENG OPTOELECTRONICS CO., LTD., Ordos (CN); BOE TECHNOLOGY GROUP CO., LTD., Beijing (CN)

(72) Inventors: Yanqing Chen, Beijing (CN); Jianyun Xie, Beijing (CN); Wei Li, Beijing (CN); Cheng Li, Beijing (CN); Pan Guo, Beijing (CN); Yanfeng Li, Beijing (CN); Weida Qin, Beijing (CN); Ning Wang, Beijing (CN)

(73) Assignees: ORDOS YUANSHENG OPTOELECTRONICS CO., LTD., Ordos (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/343,279

(22) Filed: Jun. 28, 2023

(65) Prior Publication Data
US 2023/0343874 A1    Oct. 26, 2023

Related U.S. Application Data

(63) Continuation of application No. 17/845,568, filed on Jun. 21, 2022, now Pat. No. 11,728,435, which is a
(Continued)

(30) Foreign Application Priority Data

Dec. 12, 2017    (CN) .......................... 201711313230.3

(51) Int. Cl.
*H01L 29/786*    (2006.01)
*H01L 23/552*    (2006.01)
*H01L 27/12*    (2006.01)

(52) U.S. Cl.
CPC ...... *H01L 29/78633* (2013.01); *H01L 23/552* (2013.01); *H01L 27/1259* (2013.01)

(58) Field of Classification Search
CPC ............. H01L 29/78633; H01L 23/552; H01L 27/1259; H01L 27/1248
See application file for complete search history.

(56) References Cited

U.S. PATENT DOCUMENTS

2002/0145140 A1    10/2002    Katayama
2010/0020277 A1    1/2010    Morita
(Continued)

FOREIGN PATENT DOCUMENTS

CN    103686120 A    3/2014
CN    105511152 A    4/2016
(Continued)

OTHER PUBLICATIONS

PCT International Search Report, Application No. PCT/CN2018/113746, dated Feb. 11, 2019, 6 pages: with English translation.
(Continued)

*Primary Examiner* — David Vu
(74) *Attorney, Agent, or Firm* — Armstrong Teasdale LLP

(57) ABSTRACT

The embodiments of the present disclosure provide an array substrate and a method for manufacturing the same, and a display device. The array substrate includes a substrate, wherein the substrate has a display region and a peripheral region surrounding the display region, the display region has a plurality of pixels arranged in an array, and each of the plurality of pixels includes a light transmission region and a light shielding region, and a light shielding block covering at least a part of the light transmission region of at least one pixel close to the peripheral region of the plurality of pixels.

16 Claims, 8 Drawing Sheets

Related U.S. Application Data continuation of application No. 16/343,485, filed as application No. PCT/CN2018/113746 on Nov. 2, 2018, now Pat. No. 11,404,582.

(56) References Cited

U.S. PATENT DOCUMENTS

| | | |
|---|---|---|
| 2010/0289994 A1 | 11/2010 | Nonaka |
| 2012/0088040 A1 | 4/2012 | Matsumori et al. |
| 2015/0286106 A1 | 10/2015 | Yang et al. |
| 2016/0178940 A1 | 6/2016 | Yuan et al. |
| 2016/0274420 A1 | 9/2016 | Oh et al. |
| 2017/0108630 A1 | 4/2017 | Wang et al. |
| 2017/0219893 A1 | 8/2017 | Morita |
| 2017/0351148 A1 | 12/2017 | Yoshida et al. |
| 2018/0335663 A1 | 11/2018 | Hirata et al. |

FOREIGN PATENT DOCUMENTS

| | | |
|---|---|---|
| CN | 205334901 U | 6/2016 |
| CN | 106292108 A | 1/2017 |
| CN | 107092123 | 8/2017 |
| CN | 107167957 | 9/2017 |
| CN | 107255883 A | 10/2017 |
| CN | 107357066 | 11/2017 |
| CN | 107390422 A | 11/2017 |
| CN | 107390444 A | 11/2017 |
| CN | 107422516 A | 12/2017 |
| CN | 107742499 A | 2/2018 |
| CN | 107861288 | 3/2018 |
| CN | 108364568 A | 8/2018 |
| KR | 20070015805 A | 2/2007 |

OTHER PUBLICATIONS

PCT Written Opinion, Application No. PCT/CN2018/113746, dated Feb. 11, 2019, 5 pages.: with English translation of relevant part.
China First Office Action, Application No. 201711313230.3, dated Sep. 2, 2020, 25 pps.: with English translation.
China Second Office Action, Application No. 201711313230.3, dated Mar. 29, 2021, 16 pps.: with English translation.
China Rejection Decision, Application No. 201711313230.3, dated Jul. 1, 2021, 18 pps.: with English translation.
China First Office Action, Application No. 201711341677.1, dated Jan. 19, 2020, 13 pps.: with English translation.
European Extended Search Report, Application No. 18859964.1, dated Oct. 6, 2021, 7 pps.
U.S. Non-Final Office Action, U.S. Appl. No. 16/343,485, dated Feb. 10, 2022, 22 pages.
U.S. Notice of Allowance and Allowability, U.S. Appl. No. 16/333,714, dated Sep. 15, 2021, 18 pages.
U.S. Corrected Notice of Allowability, U.S. Appl. No. 16/333,714, dated Dec. 17, 2021, 7 pages.
PCT International Search Report, Application No. PCT/CN2018/096310, dated Oct. 18, 2018, 4 pages.
PCT Written Opinion, Application No. PCT/CN2018/096310, dated Oct. 18, 2018, 5 pages.
European First Office Action, Application No. 18859964.1, dated Apr. 18, 2023, 5 pps.: with English translation.

ARRAY SUBSTRATE AND METHOD FOR MANUFACTURING THE SAME, AND DISPLAY DEVICE

CROSS REFERENCE TO RELATED APPLICATIONS

This patent application is a continuation application of U.S. patent application Ser. No. 17/845,568 filed on Jun. 21, 2022, which is a continuation application of U.S. patent application Ser. No. 16/343,485 filed on Apr. 19, 2019, which is a National Stage Entry of PCT/CN2018/113746 filed on Nov. 2, 2018, which claims the benefit and priority of Chinese Patent Application No. 201711313230.3 filed on Dec. 12, 2017, the disclosures of which are incorporated by reference herein in their entirety as part of the present application.

BACKGROUND

The present disclosure relates to the field of display techniques, and particularly, to an array substrate and a method for manufacturing the same, and a display device.

For a full-screen display device or an intelligent wearable display device having an irregular shape (e.g., circular, round-cornered, U-shaped, etc.), it is required that an edge of a display region also has a non-rectangular irregular shape, so as to meet diversified requirements of users on an appearance of a display device.

BRIEF DESCRIPTION

The embodiments of the present disclosure provide an array substrate and a method for manufacturing the same, and a display device.

A first aspect of the present disclosure provides an array substrate. The array substrate includes a substrate having a display region and a peripheral region surrounding the display region, the display region having a plurality of pixels arranged in an array, and each of the plurality of pixels including a light transmission region and a light shielding region, and a light shielding block covering at least a part of the light transmission region of at least one pixel close to the peripheral region of the plurality of pixels.

In the embodiments of the present disclosure, the array substrate further includes a thin film transistor located on the substrate and in the light shielding region, the thin film transistor including an active layer on the substrate, and the array substrate further including a light shielding layer located between the active layer and the substrate, wherein the light shielding block is disposed on a same layer as the light shielding layer.

In the embodiments of the present disclosure, the array substrate further includes a thin film transistor located on the substrate and in the light shielding region, wherein the thin film transistor includes an active layer, a gate electrode, and a gate dielectric layer therebetween, and the light shielding block is disposed on a same layer as the gate electrode.

In the embodiments of the present disclosure, the array substrate further includes a thin film transistor located on the substrate, wherein the thin film transistor includes an active layer, a gate electrode, a gate dielectric layer therebetween and a source/drain electrode disposed on the active layer, and the light shielding block is disposed on a same layer as the source/drain electrode.

In the embodiments of the present disclosure, the light shielding block includes a first portion and a second portion respectively covering opposite ends of the light transmission region of the at least one pixel close to the peripheral region.

In the embodiments of the present disclosure, the light shielding block further includes a third portion located between the first portion and the second portion.

In the embodiments of the present disclosure, a ratio of an area of the light shielding block to an area of edge pixel is set as one of N values constituting an arithmetic progression, wherein $3 \leq N \leq 101$, and the arithmetic progression has a first item of 0 and a last item of 100%.

In the embodiments of the present disclosure, an absolute value of a difference between the one of the N values and a desired set value depending on a shape of an edge of the display region is smaller than an absolute value of a difference between any other one of the N values and the desired set value.

A second aspect of the present disclosure provides a display device. The display device includes any of the array substrates as described in the first aspect of the present disclosure.

A third aspect of the present disclosure provides a method for manufacturing an array substrate, including providing a substrate having a display region and a peripheral region surrounding the display region, the display region having a plurality of pixels arranged in an array, and each of the plurality of pixels including a light transmission region and a light shielding region, and forming a light shielding block to cover at least a part of the light transmission region of at least one pixel close to the peripheral region of the plurality of pixels.

In the embodiments of the present disclosure, the method further includes forming a thin film transistor on the substrate and in the light shielding region, wherein forming the thin film transistor includes forming a light shielding material layer on the substrate, patterning the light shielding material layer to form a light shielding layer in the light shielding region, and form the light shielding block, forming a first insulating layer on the light shielding layer and the light shielding block, forming an active layer in the light shielding region and on the first insulating layer, forming a second insulating layer as a gate dielectric layer on the active layer, and forming a gate electrode in the light shielding region and on the second insulating layer.

In the embodiments of the present disclosure, the method further includes forming a thin film transistor on the substrate and in the light shielding region, wherein forming the thin film transistor includes forming an active layer on the substrate and in the light shielding region, forming a third insulating layer as a gate dielectric layer on the active layer, forming a first conductive layer on the third insulating layer, and patterning the first conductive layer to form a gate electrode in the light shielding region, and form the light shielding block.

In the embodiments of the present disclosure, before forming the active layer, the method further includes forming a light shielding layer on the substrate and in the light shielding region, and forming a fourth insulating layer on the light shielding layer.

In the embodiments of the present disclosure, the method further includes forming a thin film transistor on the substrate and in the light shielding region, wherein forming the thin film transistor includes forming a second conductive layer on the substrate, patterning the second conductive layer to form a gate electrode in the light shielding region, and form the light shielding block, forming a fourth insulating layer on the gate electrode and the light shielding block, and forming an active layer in the light shielding region and on the fourth insulating layer.

In the embodiments of the present disclosure, the method further includes forming a thin film transistor on the substrate and in the light shielding region, wherein forming the thin film transistor includes forming a third conductive layer on the substrate, patterning the third conductive layer to form a gate electrode in the light shielding region, forming a fifth insulating layer as a gate dielectric layer on the gate electrode, forming an active layer in the light shielding region and on the fifth insulating layer, forming a fourth conductive material layer on the active layer, and patterning the fourth conductive material layer to form a source/drain electrode in the light shielding region, and form the light shielding block.

In the embodiments of the present disclosure, forming a light shielding block in the light transmission region of the edge pixel includes forming a first portion and a second portion respectively covering opposite ends of the light transmission region of the edge pixel.

In the embodiments of the present disclosure, a third portion located between the first portion and the second portion is further formed.

In the embodiments of the present disclosure, a ratio of an area of the light shielding block to an area of the edge pixel is set as one of N values constituting an arithmetic progression, wherein $3 \leq N \leq 101$, and the arithmetic progression has a first item of 0 and a last item of 100%.

In the embodiments of the present disclosure, an absolute value of a difference between the one of the N values and a desired set value depending on a shape of an edge of the display region is smaller than an absolute value of a difference between any other one of the N values and the desired set value.

Further aspects and scopes of applicability will become apparent from the description provided herein. It should be understood that various aspects of this application may be implemented individually or in combination with one or more other aspects. It should also be understood that the description and specific embodiments herein are intended merely for the purpose of illustration, rather than limiting the scope of this application.

BRIEF DESCRIPTION OF THE DRAWINGS

The drawings described herein are only for the purpose of illustration of the selected embodiments rather than any possible implementation, and they are not intended to limit the scope of this application, in which.

DETAILED DESCRIPTION

Figure 1:
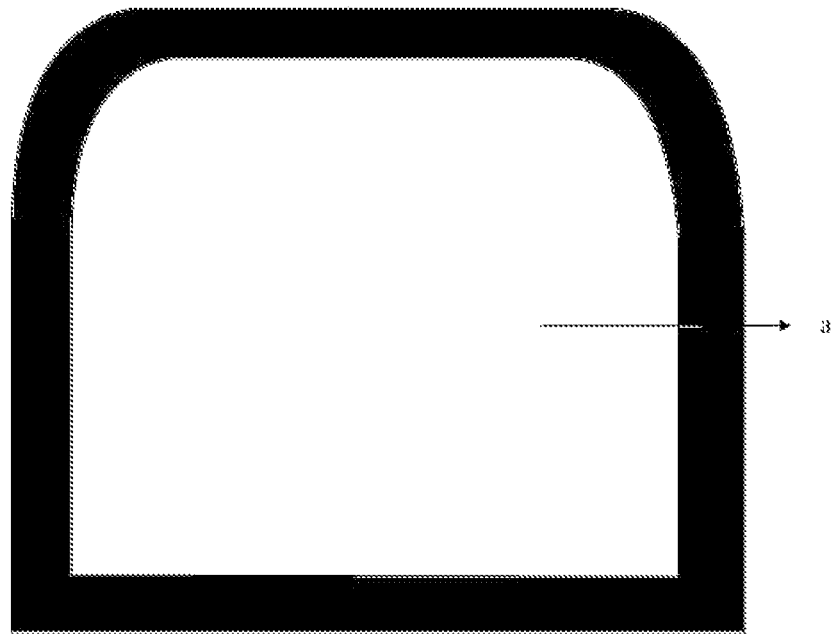
FIG. 1 illustrates a schematic diagram of a structure of a display device.

Various embodiments will now be described in detail with reference to the drawings, and those embodiments are provided as exemplary embodiments of the present disclosure to enable persons skilled in the art to implement the technical solutions of the present disclosure.

It should be noted that the following drawings and examples are not intended to limit the scope of the present disclosure. In the case where specific elements of the present disclosure can be partially or entirely implemented using known components (or methods or processes), only those portions of such known components (or methods or processes) necessary to understand the present disclosure will be described, and the detailed description of other portions of such known components will be omitted so as not to obscure the technical solutions of the present disclosure. Further, by means of illustration, various embodiments include equivalents known at present and in future, which are equivalent to the components concerned herein.

The flowchart described in the present disclosure is just one example. There may be many modifications to the flowchart or the steps described therein without departing from the spirit of the present disclosure. For example, the steps may be performed in a different order, or the steps may be added, deleted, or amended. These modifications are considered as parts of the claimed aspects.

In the description of the present disclosure, the orientations or positional relations indicated by the terms "on", "above", "under", "below", "between", etc. are those illustrated based on the drawings. They are just used to facilitate and simplify the description of the present disclosure, rather than indicating or implying that any mentioned device or element must have a particular orientation, or be constructed or operated in a particular orientation, and hence cannot be construed as limitations to the present disclosure. In addition, when an element or layer is referred to as being "on" another element or layer, it may be directly located on the another element or layer, or there may be an intermediate element or layer, similarly, when an element or layer is referred to as being "under" another element or layer, it may be directly located under the another element or layer, or there may be at least one intermediate element or layer, and when an element or layer is referred to as being "between" two elements or layers, it may be an unique element or layer between the two elements or layers, or there may be more than one intermediate element or layer.

Unless additionally and explicitly pointed out in the context, the singular form of the words used herein and in the appended claims includes the plural form, and vice versa. Thus, when a word is mentioned in the singular form, it usually includes the plural form. Similarly, the words "comprise", "comprise", "contain", "have" and grammatical modifications thereof are intended to be inclusive and indicate that there may be additional elements in addition to the listed elements. Where the term "example" is used herein, and particularly following a group of terms, it is merely exemplary and illustrative, and should not be considered as exclusive or extensive. The terms "first", "second", "third" and the like are just used for description, and should not be understood as indicating or implying any relative importance or formation order.

Figure 2:
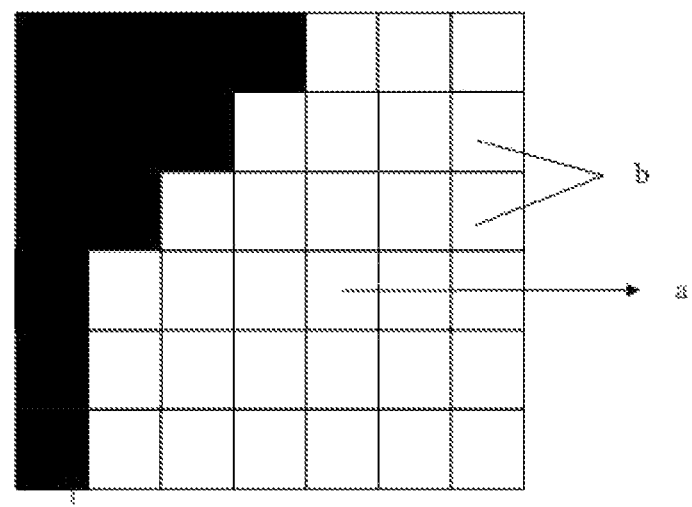
FIG. 2 illustrates a schematic diagram of a part of an array substrate of the display device as illustrated in FIG. 1.

FIG. 1 illustrates a schematic diagram of a structure of a display device. FIG. 2 illustrates a schematic diagram of a part of an array substrate of the display device as illustrated in FIG. 1. As illustrated in FIG. 1, an edge of a display region a of the display device is round-cornered macroscopically. However, microscopically, as illustrated in FIG. 2, pixels b in the display region a are generally rectangular, and since an arrangement of the pixels b at the edge is uneven, the edge of the display region a appears to be sawtoothed. Thus, on displaying, the edge of the display region a will present a graininess and sawtooth feeling, thereby affecting the display effect of the display device.

Figure 3:
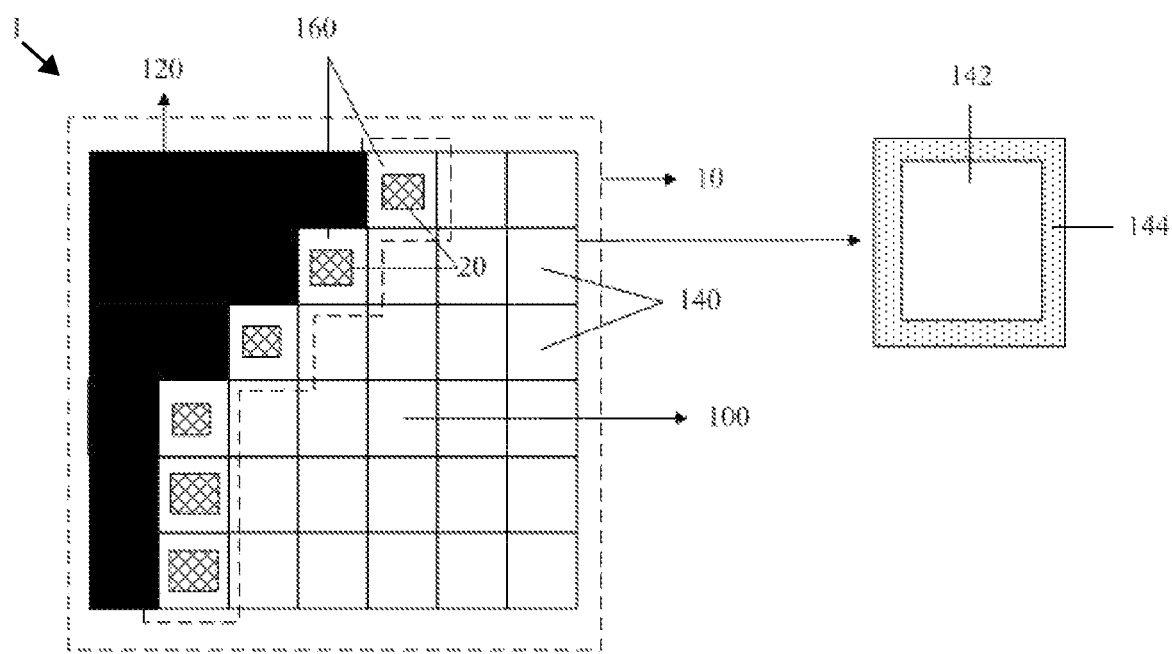
FIG. 3 illustrates a schematic diagram of a part of an array substrate according to an embodiment of the present disclosure.

FIG. 3 illustrates a schematic diagram of a part of an array substrate according to an embodiment of the present disclosure. As illustrated in FIG. 3, the array substrate 1 may include a substrate 10. The substrate 10 has a display region 100 and a peripheral region 120 surrounding the display region 100. The peripheral region 120 may be disposed corresponding to a black matrix (not illustrated) on a color filter substrate (not illustrated). The display region 100 has a plurality of pixels 140 arranged in an array, and the pixels 140 may be disposed corresponding to color block (not illustrated) on the color filter substrate. The pixel 140 includes a light transmission region 142 and a light shielding region 144. The pixels located outside the display region 100 constitute a plurality of edge pixels 160, i.e., pixels close to the peripheral region. According to the embodiment of the present disclosure, the array substrate 1 may further include a light shielding block 20 that covers at least a part of the light transmission region 142 of the edge pixel 160 to shield light transmission.

According to the embodiment of the present disclosure, since the light shielding block 20 covers at least a part of the light transmission region 142 of the edge pixel 160 of the array substrate 1, a light transmittance of the edge pixel 160 (i.e., a ratio of a difference between an area of the light transmission region and an area of the light shielding block to an area of the light transmission region) is reduced, and a brightness of the edge pixel 160 is decreased, thereby reducing the acuity of human eyes in capturing the edge of the display region having a non-rectangular shape, finally relieving the problem of graininess and sawtooth feeling at the edge of the display region, and improving the display effect.

It should be noted that FIG. 3 illustrates only a part of the array substrate having the non-rectangular edge. In addition, the number of the pixels is not limited and can be set based on the actual need.

Figure 4:
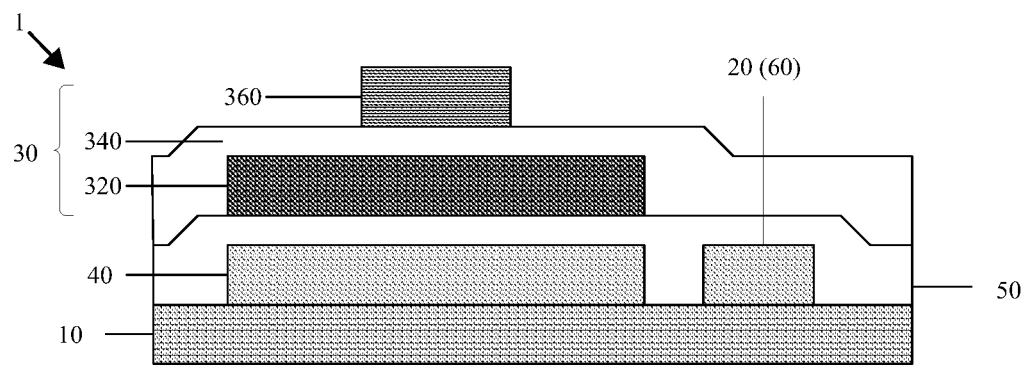
FIG. 4 illustrates a cross-sectional diagram of an array substrate according to an embodiment of the present disclosure.

FIG. 4 illustrates a cross-sectional diagram of an edge pixel of an array substrate 1 according to an embodiment of the present disclosure. According to the embodiment of the present disclosure, the array substrate 1 may further include a thin film transistor 30 located on the substrate 10 and in the light shielding region 144. The thin film transistor 30 includes an active layer 320, a gate dielectric layer 340, and a gate electrode 360 sequentially disposed on the substrate 10, i.e., the thin film transistor 30 is a top gate structure.

According to the embodiment of the present disclosure, a material of the active layer may include Low Temperature Poly-Silicon (LTPS). The array substrate 1 may further include a light shielding layer 40 located between the active layer 320 and the substrate 10. The light shielding layer 40 can prevent light rays from irradiating the active layer, and then avoid the performance of the thin film transistor 30 from being affected. According to the embodiment of the present disclosure, the light shielding block 20 in the light transmitting region 142 of the edge pixel 160 may be disposed on a same layer as the light shielding layer 40. It should be noted that in the embodiments of the present disclosure, "disposed on a same layer" means being formed of a same film layer. The light shielding layer 40 and the light shielding block 20 thus may be made of a same material. In this case, the light shielding layer 40 and the light shielding block 20 can be simultaneously formed by the masking, exposing and etching processes at one time, thereby simplifying the process flow. In addition, an insulating layer 50 is disposed between the light shielding layer 40 and the active layer 320.

As can be seen from the above description, the light transmittance of the edge pixel 160 can be reduced by disposing the light shielding block 20 in the light transmission region 142 of the edge pixel 160 of the array substrate 1, thereby relieving the problem of graininess and sawtooth feeling at the edge of the display region, and improving the display effect. In addition, by disposing the light shielding block 20 on a same layer as the light shielding layer 40, the process flow can be simplified.

Figure 5:
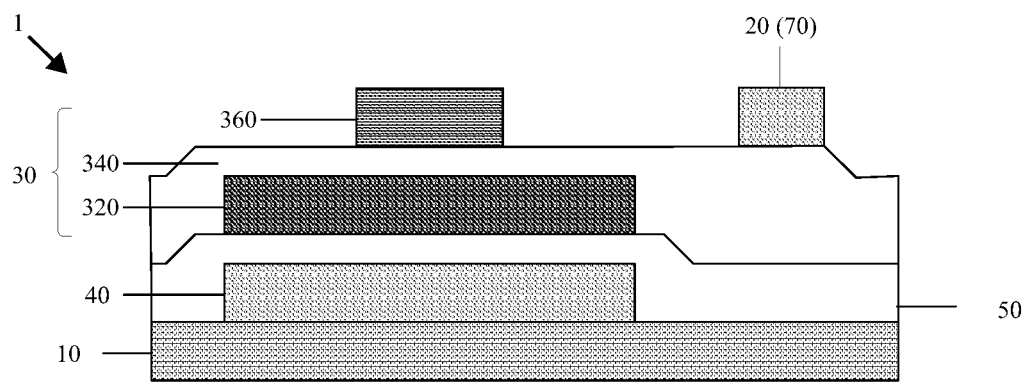
FIG. 5 illustrates a cross-sectional diagram of an array substrate according to another embodiment of the present disclosure.

FIG. 5 illustrates a cross-sectional diagram of an edge pixel of an array substrate 1 according to another embodiment of the present disclosure. According to the embodiment of the present disclosure, the array substrate 1 may further include a thin film transistor 30 located on the substrate 10 and in the light shielding region 144. Like the thin film transistor 30 as illustrated in FIG. 4, the thin film transistor 30 includes an active layer 320, a gate dielectric layer 340, and a gate electrode 360 sequentially disposed on the substrate 10. The array substrate 1 further includes a light shielding layer 40 disposed between the active layer 320 and the substrate 10, and an insulating layer 50 disposed between the light shielding layer 40 and the active layer 320. According to the embodiment of the present disclosure, the light shielding block 20 in the light transmission region 142 of the edge pixel 160 may be disposed on a same layer as the gate electrode 360. The light shielding block 20 and the gate electrode 360 may be made of a same material. In this case, the light shielding block 20 and the gate electrode 360 can be simultaneously formed by the masking, exposing, and etching processes at one time, thereby simplifying the process flow.

Figure 6:
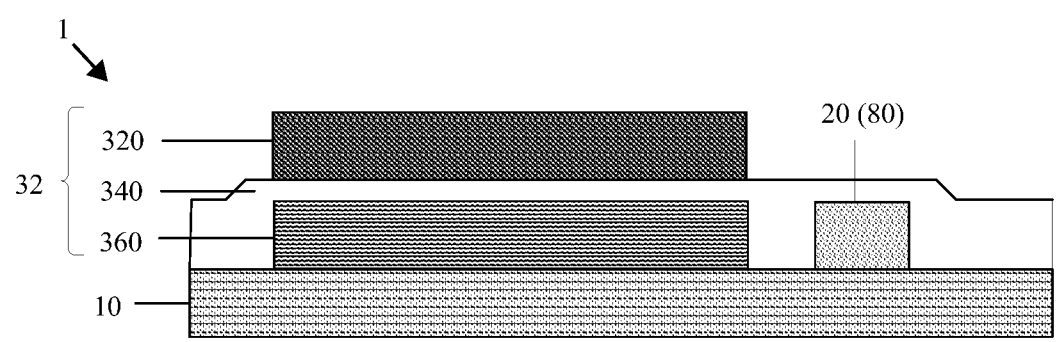
FIG. 6 illustrates a cross-sectional diagram of an array substrate according to still another embodiment of the present disclosure.

FIG. 6 illustrates a cross-sectional diagram of an edge pixel of an array substrate 1 according to still another embodiment of the present disclosure. According to the embodiment of the present disclosure, the array substrate 1 may further include a thin film transistor 32 located on the substrate 10 and in the light shielding region 144. The thin film transistor 32 includes a gate electrode 360, a gate dielectric layer 340, and an active layer 320 sequentially disposed on the substrate 10, i.e., the thin film transistor 32 is a bottom gate structure. According to the embodiment of the present disclosure, the light shielding block 20 in the light transmitting region 142 of the edge pixel 160 may be disposed on a same layer as the gate electrode 360. The light shielding block 20 and the gate electrode 360 may be made of a same material. In this case, the light shielding block 20 and the gate electrode 360 can be simultaneously formed by the masking, exposing, and etching processes at one time, thereby simplifying the process flow.

As can be seen from the above description, the light transmittance of the edge pixel 160 can be reduced by disposing the light shielding block 20 to cover at least a part of the light transmission region 142 of the edge pixel 160 of the array substrate 1, thereby relieving the problem of graininess and sawtooth feeling at the edge of the display region, and improving the display effect. In addition, by disposing the light shielding block 20 on a same layer as the gate electrode 360, the process flow can be simplified.

Figure 7:
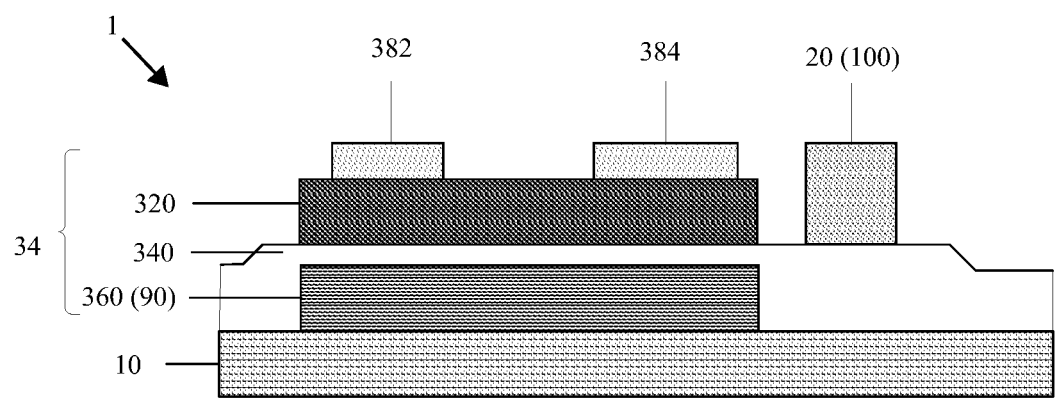
FIG. 7 illustrates a cross-sectional diagram of an array substrate according to yet another embodiment of the present disclosure.

FIG. 7 illustrates a cross-sectional diagram of an edge pixel of an array substrate 1 according to yet another embodiment of the present disclosure. According to the embodiment of the present disclosure, the array substrate 1 may further include a thin film transistor 34 located on the substrate 10 and in the light shielding region 144. The thin film transistor 34 includes a gate electrode 360, a gate dielectric layer 340, and an active layer 320 sequentially disposed on the substrate 10, i.e., the thin film transistor 34 is a bottom gate structure. According to the embodiment of the present disclosure, the thin film transistor 34 may further include a source electrode 382/drain electrode 384 disposed on the active layer 320. The light shielding block 20 in the light transmission region 142 of the edge pixel 160 may be disposed on a same layer as the source electrode 382/drain electrode 384. The light shielding block 20 and the source electrode 382/drain electrode 384 may be made of a same material. In this case, the light shielding block 20 and the source electrode 382/drain electrode 384 can be simultaneously formed by the masking, exposing, and etching processes at one time, thereby simplifying the process flow.

As can be seen from the above description, the light transmittance of the edge pixel 160 can be reduced by disposing the light shielding block 20 to cover at least a part of the light transmission region 142 of the edge pixel 160 of the array substrate 1, thereby relieving the problem of graininess and sawtooth feeling at the edge of the display region, and improving the display effect. In addition, by disposing the light shielding block 20 on a same layer as the source electrode 382/drain electrode 384, the process flow can be simplified.

Figure 8A:
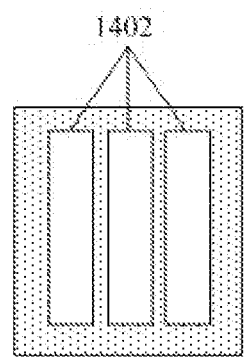
FIGS. 8A and 8B illustrate schematic diagrams of a structure of a pixel according to an embodiment of the present disclosure.
Figure 8B:
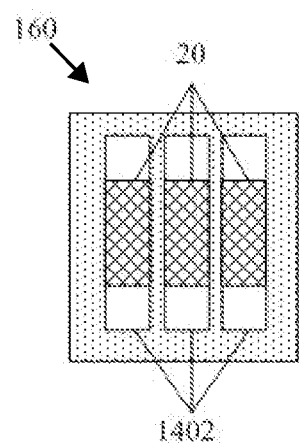

According to the embodiment of the present disclosure, FIGS. 8A and 8B illustrate schematic diagrams of a structure of a pixel 140 according to an embodiment of the present disclosure. As illustrated in FIGS. 8A and 8B, a pixel 140 and an edge pixel 160 each may include three sub-pixels 1402 located in a light transmission region 142. The sub-pixels 1402 may be red, green, and blue sub-pixels, respectively, which may be disposed corresponding to respective color block (not illustrated) on the color film substrate. For the edge pixel 160, as illustrated in FIG. 8B, the light shielding block 20 may be disposed within the three sub-pixels 1402 to shield light transmission. Specifically, the light shielding block 20 within each of the sub-pixels 1402 may have a same area, so that each of the sub-pixels 1402 in a same edge pixel 160 has a same light transmittance, thereby avoiding the problem that one of the sub-pixels 1402 is too bright and causing color difference.

Figure 9A:
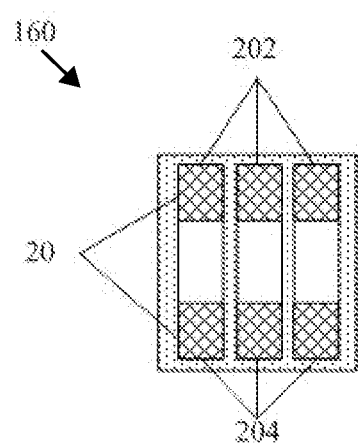
FIGS. 9A and 9B illustrate schematic diagrams of a structure of an edge pixel according to an embodiment of the present disclosure.
Figure 9B:
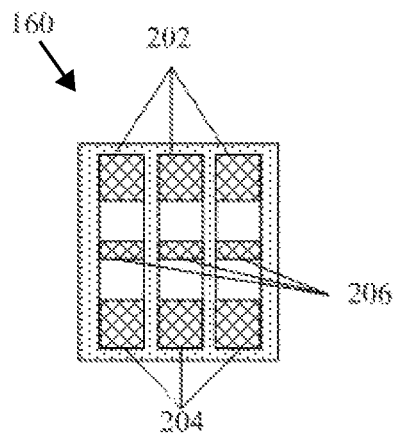

According to the embodiment of the present disclosure, FIGS. 9A and 9B illustrate schematic diagrams of a structure of an edge pixel 160 according to an embodiment of the present disclosure. As illustrated in FIG. 9A, the light shielding block 20 may include a first portion 202 and a second portion 204 that cover opposite ends of a light transmission region of an edge pixel 160, respectively. In this way, the edge pixel 160 can be covered finely to achieve a better display effect. According to the embodiment of the present disclosure, as illustrated in FIG. 9B, the light shielding block 20 may further include a third portion 206 located between the first portion 202 and the second portion 204. In this way, the edge pixel 160 can be further covered finely to achieve a better display effect.

According to the embodiment of the present disclosure, an area of the light shielding block 20 of each of the edge pixels 160 may be set according to a desired shape of an edge of the display region 100. However, since the area of each of the light shielding blocks may be different depending on the shape of the edge, it is necessary to separately design a mask for each of the light shielding blocks, which potentially increases the number of the masks. In order to reduce the number of the masks, a ratio of the area of the light shielding block 20 of the edge pixel 160 to an area of the edge pixel 160 may be set as one of N values constituting an arithmetic progression, and specifically, $3 \leq N \leq 101$. The arithmetic progression has a first item of 0 and a last item of 100%. This setting can reduce the number of the mask during manufacturing. In an exemplary embodiment, N is equal to 9, and the arithmetic progression may be 0, 12.5%, 25%, 37.5%, 50%, 62.5%, 75%, 87.5%, 100%. According to the embodiment of the present disclosure, an absolute value of a difference between one of the N values and a desired set value depending on the shape of the edge of the display region may be smaller than an absolute value of a difference between any other one of the N values and the desired set value. For example, according to the shape of the edge of the display region 100, if a ratio of an area of the light shielding block 20 of one of the edge pixels 160 to an area of the edge pixel 160 should be 68%, the ratio of the area of the light shielding block 20 of the edge pixels 160 to the area of the edge pixel 160 can be set as 62.5%, i.e., a value closest to 68% selected from the above arithmetic progression. In another exemplary embodiment, N is equal to 3, and the arithmetic progression may be 0, 50%, 100%. In still another exemplary embodiment, N is equal to 4, and the arithmetic progression may be 0, 33.3%, 66.6%, 100%. It will be understood that the above N values may not constitute an arithmetic progression and can be set based on the actual needs.

Figure 10:
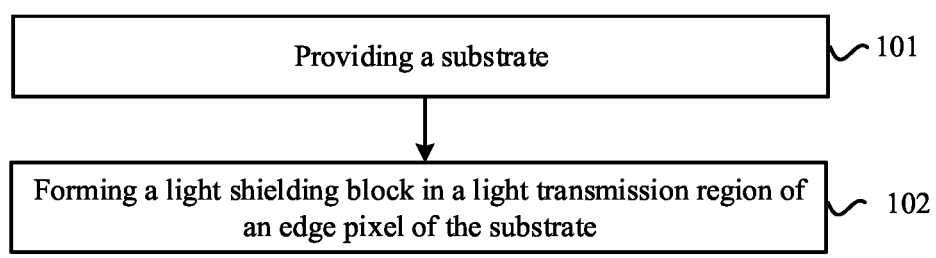
FIG. 10 illustrates a flowchart of a method for manufacturing an array substrate according to an embodiment of the present disclosure.

In another aspect of the present disclosure, a method for manufacturing an array substrate described herein is provided. FIG. 10 illustrates a flowchart of a method for manufacturing an array substrate according to an embodiment of the present disclosure.

The method for manufacturing the array substrate may include the following steps:

S101: providing a substrate; and

S102: forming a light shielding block to cover at least a part of a light transmission region of an edge pixel of the substrate.

In this embodiment, the substrate has a display region and a peripheral region surrounding the display region. The display region has a plurality of pixels arranged in an array, and each of the pixels includes a light transmission region and a light shielding region. The pixels located outside the display region constitute a plurality of edge pixels.

According to the embodiment of the present disclosure, in S102, the light shielding block may include a first portion and a second portion that cover opposite ends of a light transmission region of an edge pixel, respectively. In this way, the edge pixel can be covered finely to achieve a better display effect. According to the embodiment of the present disclosure, the light shielding block may further include a third portion located between the first portion and the second portion. In this way, the edge pixel can be further covered finely to achieve a better display effect.

According to the embodiment of the present disclosure, an area of the light shielding block of each of the edge pixels may be set according to a desired shape of an edge of the display region. A ratio of the area of the light shielding block 20 of the edge pixel 160 to an area of the edge pixel 160 may be set as one of N values constituting an arithmetic progression, and specifically, 3≤N≤101. The arithmetic progression has a first item of 0 and a last item of 100%. This setting can reduce the number of the mask during manufacturing. In an exemplary embodiment, N is equal to 9, and the arithmetic progression may be 0, 12.5%, 25%, 37.5%, 50%, 62.5%, 75%, 87.5%, 100%. In another exemplary embodiment, N is equal to 3, and the arithmetic progression may be 0, 50%, 100%. In still another exemplary embodiment, N is equal to 4, and the arithmetic progression may be 0, 33.3%, 66.6%, 100%. It will be understood that the above N values may not constitute an arithmetic progression and can be set based on the actual needs.

As can be seen from the above description, since the light shielding block covers the light transmission region of the edge pixel, a light transmittance of the edge pixel is reduced, and a brightness of the edge pixel is decreased, thereby reducing the acuity of human eyes in capturing the edge of the display region having a non-rectangular shape, finally relieving the problem of graininess and sawtooth feeling at the edge of the display region, and improving the display effect.

According to an embodiment of the present disclosure, the method for manufacturing the array substrate may further include forming a thin film transistor on the substrate and in the light shielding region. Specifically, the steps of forming the thin film transistor may include S201 to S206.

S201: forming a light shielding material layer 60 on the substrate 10;

S202: patterning the light shielding material layer 60 to form a light shielding layer 40 in the light shielding region, and form the light shielding block 20;

S203: forming a first insulating layer 50 on the light shielding layer 40 and the light shielding block 20;

S204: forming an active layer 320 in the light shielding region and on the first insulating layer 50;

S205: forming a second insulating layer (i.e., 340) as a gate dielectric layer 340 on the active layer 320; and S206: forming a gate electrode 360 in the light shielding region and on the second insulating layer 340.

The method provided by this embodiment is used for the array substrate as illustrated in FIG. 4 and described in the aforementioned embodiments, and its structure, function, and/or advantages are the same as those of the array substrate in the aforementioned embodiments, which will not be described in detail here.

According to another embodiment of the present disclosure, the method for manufacturing the array substrate may further include forming a thin film transistor on the substrate and in the light shielding region. Specifically, the steps of forming the thin film transistor may include S301 to S304.

S301: forming an active layer 320 on the substrate 10 and in the light shielding region;

S302: forming a third insulating layer (i.e., 340) as a gate dielectric layer 340 on the active layer 320;

S303: forming a first conductive layer 70 on the third insulating layer 340;

S304: patterning the first conductive layer 70 to form a gate electrode 360 in the light shielding region, and form the light shielding block 20.

In this embodiment, before S301, the method may further include forming a light shielding layer 40 on the substrate 10 and in the light shielding region, and forming a fourth insulating layer 50 on the light shielding layer 40.

The method provided by this embodiment is used for the array substrate as illustrated in FIG. 5 and described in the aforementioned embodiments, and its structure, function, and/or advantages are the same as those of the array substrate in the aforementioned embodiments, which will not be described in detail here.

According to still another embodiment of the present disclosure, the method for manufacturing the array substrate may further include forming a thin film transistor on the substrate and in the light shielding region. Specifically, the steps of forming the thin film transistor may include S401 to S404.

S401: forming a second conductive layer 80 on the substrate 10;

S402: patterning the second conductive layer 80 to form a gate electrode 360 in the light shielding region, and form the light shielding block 20;

S403: forming a fourth insulating layer 340 on the gate electrode 360 and the light shielding block 20;

S404: forming an active layer 320 in the light shielding region and on the fourth insulating layer 340.

The method provided by this embodiment is used for the array substrate as illustrated in FIG. 6 and described in the aforementioned embodiments, and its structure, function, and/or advantages are the same as those of the array substrate in the aforementioned embodiments, which will not be described in detail here.

According to yet another embodiment of the present disclosure, the method for manufacturing the array substrate may further include forming a thin film transistor on the substrate and in the light shielding region. Specifically, the steps of forming the thin film transistor may include S501 to S506.

S501: forming a third conductive layer 90 on the substrate 10;

S502: patterning the third conductive layer 90 to form a gate electrode 360 in the light shielding region;

S503: forming a fifth insulating layer (i.e., 340) as a gate dielectric layer 340 on the gate electrode 360;

S504: forming an active layer 320 in the light shielding region and on the fifth insulating layer 340;

S505: forming a fourth conductive material layer 100 on the active layer 320;

S506: patterning the fourth conductive material layer 100 to form a source 382/drain 384 electrode in the light shielding region, and form the light shielding block 20.

The method provided by this embodiment is used for the array substrate as illustrated in FIG. 7 and described in the aforementioned embodiments, and its structure, function, and/or advantages are the same as those of the array substrate in the aforementioned embodiments, which will not be described in detail here.

Figure 11:
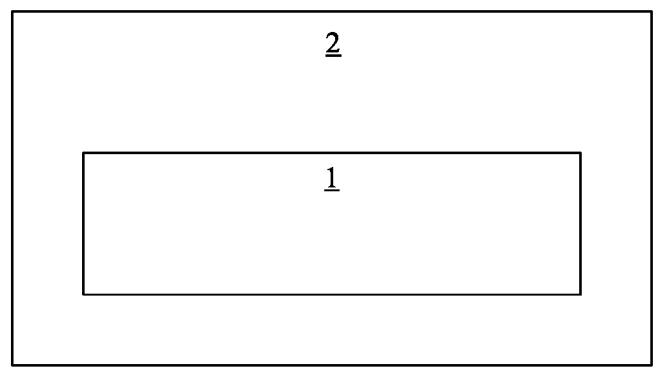
FIG. 11 illustrates a schematic diagram of a display device according to an embodiment of the present disclosure.

In still another aspect of the present disclosure, there is also provided a display device including the array substrate described in the aforementioned embodiments. FIG. 11 illustrates a schematic diagram of a display device according to an embodiment of the present disclosure. As illustrated in FIG. 11, the display device 2 according to the present disclosure includes the aforementioned array substrate 1. The light transmittance of the edge pixel can be reduced by disposing the light shielding block to cover at least a part of the light transmission region of the edge pixel of the array substrate of the display device, thereby relieving the problem of graininess and sawtooth feeling at the edge of the display region, and improving the display effect.

The foregoing descriptions of the embodiments have been provided as above for the purposes of illustration and description, and they are not intended to be exhaustive or to limit this disclosure. Various elements or features of a particular embodiment are generally not limited to that particular embodiment, but where applicable, they are interchangeable and can be used in a selected embodiment, even if not specifically illustrated or described. Similarly, variations may also be made in many ways while should not be considered as departures from this disclosure, and all the modifications are included in the scope of this disclosure.

What is claimed is:

1. A display substrate comprising:
    a substrate including a display region and a peripheral region surrounding the display region, the display region having a plurality of pixels arranged in an array, and each of the plurality of pixels comprising a light transmission region and a light shielding region; and
    a light shielding block for defining the light transmission region and the light shielding region,
    an edge pixel located at boundary of the display region, wherein the edge pixel comprises at least three sub-pixels of different color, in one of the at least three sub-pixels, the light shielding block comprising a first portion, a second portion, and a third portion between the first portion and the second portion, the first, second, and third portions separated from each other.

2. The display substrate according to claim 1, wherein the first portion, the third portion, and the second portion are arranged orderly along a longitude direction of the one of the at least three sub-pixels.

3. The display substrate according to claim 1, wherein the light shielding block within each of the at least three sub-pixels has a same area.

4. The display substrate according to claim 1, wherein the first portion and the second portion are substantially symmetric with respect to the third portion.

5. The display substrate according to claim 1, wherein a ratio of an area of the light shielding block of the one of the at least three sub-pixels is negative correlated with a distance to the peripheral region.

6. The display substrate according to claim 1, wherein a ratio of an area of the light shielding block to an area of the one of the at least three sub-pixels close to the peripheral region is set as one of N values constituting an arithmetic progression, wherein $3 \leq N \leq 101$, and wherein the arithmetic progression has a first item of 0 and a last item of 100%.

7. The display substrate according to claim 6, wherein an absolute value of a difference between the one of the N values and a desired set value depending on a shape of an edge of the display region is smaller than an absolute value of a difference between any other one of the N values and the desired set value.

8. The display substrate according to claim 6, wherein N is equal to 3, and wherein the arithmetic progressions are 0, 50%, 100%, respectively.

9. The display substrate according to claim 6, wherein N is equal to 4, and wherein the arithmetic progressions are 0, 33.3%, 66.6%, 100%, respectively.

10. The display substrate according to claim 6, wherein N is equal to 9, and wherein the arithmetic progression are 0, 12.5%, 25%, 37.5%, 50%, 62.5%, 75%, 87.5%, 100%, respectively.

11. The display substrate according to claim 1, further comprising:
    a thin film transistor located on the substrate and in the light shielding region, the thin film transistor comprising an active layer on the substrate; and
    a light shielding layer located between the active layer and the substrate,
    wherein the light shielding block is disposed on a same layer as the light shielding layer.

12. The display substrate according to claim 1, further comprising:
    a thin film transistor located on the substrate and in the light shielding region, the thin film transistor comprising an active layer, a gate electrode, and a gate dielectric layer therebetween, wherein the light shielding block is disposed on a same layer as the gate electrode.

13. The display substrate according to claim 1, further comprising:
    a thin film transistor located on the substrate and in the light shielding region, the thin film transistor comprising an active layer, a gate electrode, a gate dielectric layer therebetween, and a source/drain electrode disposed on the active layer, wherein the light shielding block is disposed on a same layer as the source/drain electrode.

14. The display substrate according to claim 1, wherein the display region has a non-rectangular shape.

15. The display substrate according to claim 1, wherein the light shielding block is absent in a region surrounded by boundary lines of sub-pixels of the plurality of pixels located in the display region.

16. A display device comprising the display substrate according to claim 1.

* * * * *